(12) United States Patent
Hassan (10) Patent No.: US 10,365,997 B2
(45) Date of Patent: Jul. 30, 2019

(54) OPTIMIZING DRAM MEMORY BASED ON READ-TO-WRITE RATIO OF MEMORY ACCESS LATENCY

(71) Applicant: Hybris AG, Zug (CH)

(72) Inventor: Ahmad Hassan, Belfast (GB)

(73) Assignee: Hybris AG, Zug (CH)

( * ) Notice: Subject to any disclaimer, the term of this patent is extended or adjusted under 35 U.S.C. 154(b) by 155 days.

(21) Appl. No.: 15/677,654

(22) Filed: Aug. 15, 2017

(65) Prior Publication Data

US 2019/0057023 A1    Feb. 21, 2019

(51) Int. Cl.
*G06F 12/02* (2006.01)
*G11C 7/10* (2006.01)

(52) U.S. Cl.
CPC .......... *G06F 12/0207* (2013.01); *G06F 12/02* (2013.01); *G06F 12/0238* (2013.01); *G11C 7/1036* (2013.01); *G11C 7/1042* (2013.01)

(58) Field of Classification Search
CPC ....... G06F 12/02; G06F 12/0207; G06F 14/16
USPC ........................................................ 711/105
See application file for complete search history.

(56) References Cited

U.S. PATENT DOCUMENTS

| | | | | |
|---|---|---|---|---|
| 2015/0286416 | A1* | 10/2015 | Astigarraga | H04L 41/142 709/224 |
| 2015/0288570 | A1* | 10/2015 | Astigarraga | H04L 41/142 703/21 |
| 2017/0124231 | A1* | 5/2017 | Astigarraga | H04L 41/142 |

OTHER PUBLICATIONS

U.S. Appl. No. 14/704,461, filed May 5, 2015, Ahmad Hassan.
U.S. Appl. No. 14/831,567, filed Aug. 20, 2015, Ahmad Hassan.
U.S. Appl. No. 14/831,624, filed Aug. 20, 2015, Ahmad Hassan.
U.S. Appl. No. 15/213,621, filed Jul. 19, 2016, Ahmad Hassan.
U.S. Appl. No. 15/213,626, filed Jul. 19, 2016, Ahmad Hassan.
U.S. Appl. No. 15/213,654, filed Jul. 19, 2016, Ahmad Hassan.
U.S. Appl. No. 15/213,674, filed Jul. 19, 2016, Ahmad Hassan.
U.S. Appl. No. 15/213,754, filed Jul. 19, 2016, Ahmad Hassan.
U.S. Appl. No. 15/213,816, filed Jul. 19, 2016, Ahmad Hassan.
U.S. Appl. No. 15/213,861, filed Jul. 19, 2016, Ahmad Hassan.
U.S. Appl. No. 15/213,930, filed Jul. 19, 2016, Ahmad Hassan.
U.S. Appl. No. 15/213,960, filed Jul. 19, 2016, Ahmad Hassan.
U.S. Appl. No. 15/214,019, filed Jul. 19, 2016, Ahmad Hassan.
U.S. Appl. No. 15/214,082, filed Jul. 19, 2016, Ahmad Hassan.
U.S. Appl. No. 15/214,102, filed Jul. 19, 2016, Ahmad Hassan.

* cited by examiner

*Primary Examiner* — Than Nguyen
(74) *Attorney, Agent, or Firm* — Fish & Richardson P.C.

(57) ABSTRACT

Implementations of the present disclosure include methods, systems, and computer-readable storage mediums for receiving a memory access latency value including a time to perform an operation with respect to the memory bank of the plurality of memory banks, receiving a set of operation percentages including an operation percentage for each of a plurality of operations performed on the memory bank, determining a probability associated with the memory access latency value using a mixture of Weibull distributions, described herein, comparing the probability to a threshold probability to provide a comparison, and selectively executing at least one action with respect to the memory bank based on the comparison.

20 Claims, 4 Drawing Sheets

OPTIMIZING DRAM MEMORY BASED ON READ-TO-WRITE RATIO OF MEMORY ACCESS LATENCY

BACKGROUND

Enterprises, such as business enterprises, operate enterprise systems to provide software functionality to customers and employees. In some examples, an enterprise system can include back-end enterprise servers that host enterprise applications. Example enterprise applications include enterprise resource planning (ERP) systems, client-relationship management (CRM) systems, product lifecycle management (PLM) systems, supply chain management (SCM) systems, and supplier relationship management (SRM) systems. During operation of an enterprise application, application data is accessed, which is stored in main memory of the enterprise server. In this manner, the application data is immediately accessible by processors of the enterprise server.

Increasingly large amounts of application data are stored in the main memory of enterprise servers. Main memory can include dynamic random access memory (DRAM), which consumes a relatively high amount of static energy (both in active and idle states) due to continuous leakage and refresh power. Non-volatile memory (NVM), also referred to as storage class memory (SCM) (e.g., phase change memory (PCM)) can address fundamental limitations of DRAM. Characteristics that differentiate NVM from DRAM include data persistence, high latency, high write energy, low static energy and low write endurance (e.g., wear-out of cells). Physically, NVM is inserted into a memory bus along with DRAM.

SUMMARY

Implementations of the present disclosure include computer-implemented methods for controlling operations performed on a memory bank of a plurality of memory banks. In some implementations, methods include actions of receiving a memory access latency value including a time to perform an operation with respect to the memory bank of the plurality of memory banks, receiving a set of operation percentages including an operation percentage for each of a plurality of operations performed on the memory bank, determining a probability associated with the memory access latency value using a mixture of Weibull distributions, described herein, comparing the probability to a threshold probability to provide a comparison, and selectively executing at least one action with respect to the memory bank based on the comparison. Other implementations of this aspect include corresponding systems, apparatus, and computer programs, configured to perform the actions of the methods, encoded on computer storage devices.

These and other implementations can each optionally include one or more of the following features: the at least one action includes inhibiting an operation to be performed on the memory bank in response to determining that the probability exceeds the threshold; the operation includes one of a read operation and a write operation to the memory bank; the number of Weibull distributions is 2; the set of operation percentages includes a read operation percentage, and a write operation percentage for the memory bank; the plurality of memory banks each include a dynamic random access memory (DRAM) bank; and the plurality of memory banks are provided in a main memory system of one or more computing devices.

The present disclosure also provides one or more non-transitory computer-readable storage media coupled to one or more processors and having instructions stored thereon which, when executed by the one or more processors, cause the one or more processors to perform operations in accordance with implementations of the methods provided herein.

The present disclosure further provides a system for implementing the methods provided herein. The system includes one or more processors, and a computer-readable storage medium coupled to the one or more processors having instructions stored thereon which, when executed by the one or more processors, cause the one or more processors to perform operations in accordance with implementations of the methods provided herein.

It is appreciated that methods in accordance with the present disclosure can include any combination of the aspects and features described herein. That is, methods in accordance with the present disclosure are not limited to the combinations of aspects and features specifically described herein, but also include any combination of the aspects and features provided.

The details of one or more implementations of the present disclosure are set forth in the accompanying drawings and the description below. Other features and advantages of the present disclosure will be apparent from the description and drawings, and from the claims.

DESCRIPTION OF DRAWINGS

Like reference symbols in the various drawings indicate like elements.

DETAILED DESCRIPTION

Implementations of the present disclosure are generally directed to controlling operations performed on a memory bank of a plurality of memory banks. In some implementations, actions include receiving a memory access latency value including a time to perform an operation with respect to the memory bank of the plurality of memory banks, receiving a set of operation percentages including an operation percentage for each of a plurality of operations performed on the memory bank, determining a probability associated with the memory access latency value using a mixture of Weibull distributions, described herein, comparing the probability to a threshold probability to provide a comparison, and selectively executing at least one action with respect to the memory bank based on the comparison.

Implementations of the present disclosure are described herein with reference to an example memory system. The example memory system includes a hybrid main memory system, which includes multiple types of memory. It is contemplated, however, that implementations of the present disclosure can be realized in any appropriate memory system, such as, for example, non-hybrid main memory systems (e.g., DRAM-only main memory). In hybrid main memory systems, multiple types of memory (e.g., DRAM, NVM), are implemented to address respective advantages and disadvantages of DRAM and NVM. The concept behind hybrid main memory is that a small amount of DRAM holds frequently accessed data (hot data) and provides low latency and low dynamic energy, while a large amount of NVM is used to implement a scalable memory system and store the majority of less frequently accessed data (cold data).

The availability of low cost and large capacity main memory has brought a breakthrough in real-time analytics, and implementing application functionality that was previously not feasible. Real-time systems aim at making knowledge available with sub-second and often sub-millisecond response times. In an example context, real-time access to business information helps gain competitive advantage through efficient and improved decision making. In recent years, increasingly large amounts of data are stored in main memory to provide high throughput services. Main memory, however, is a key energy consumer, and a critical component of system design.

DRAM is the de-facto technology for main memory in modern computing systems. However, DRAM faces several challenges moving forward. For example, and according to the International Technology Roadmap for Semiconductors (ITRS), DRAM is unlikely to scale beyond 22 nm, which restricts the amount of main memory available to a system. Moreover, DRAM consumes significant static energy, both in active and idle state, due to continuous leakage and refresh power. The access latency (e.g., time required to read from, or write to memory), and power consumption are also closely related. DRAM-based main memory includes memory cells, which are placed on memory banks. A single DRAM chip includes multiple banks. When the memory is accessed by a processor, the data is located on a particular DRAM bank.

Figure 1:
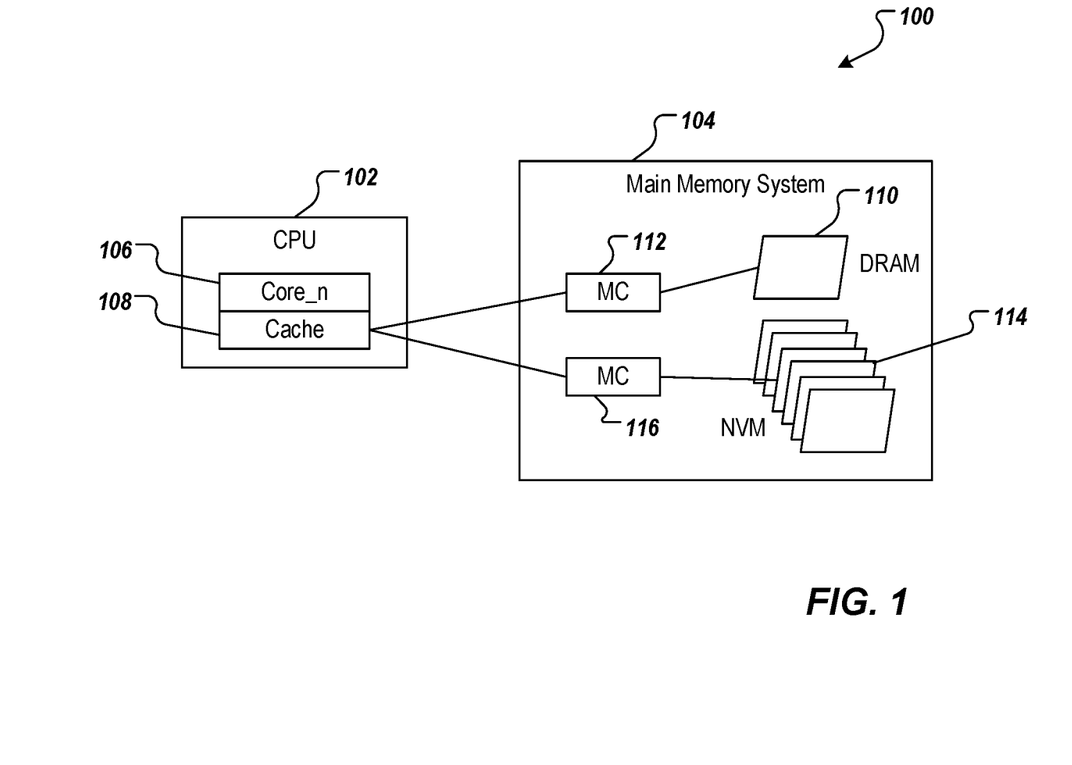
FIG. 1 depicts an example hybrid main memory architecture in accordance with implementations of the present disclosure.

FIG. 1 depicts an example memory architecture 100 that can be implemented within an enterprise server. In the example of FIG. 1, the example memory architecture 100 includes a central processing unit (CPU) 102 and a main memory system 104. The CPU 102 includes a core 106 having a respective cache 108. Although a single core and respective cache 108 is depicted, it is appreciated that the CPU 102 can include multiple cores, each with a respective cache. Further, although a single CPU 102 is depicted, it is appreciated that enterprise servers can include multiple CPUs. The main memory system 104 includes DRAM 110 with a respective memory controller (MC) 112, and NVM 114 with a respective MC 116. In some examples, the cache 108 accesses (e.g., read, write, delete) the DRAM 110 through the MC 112, and accesses (e.g., read, write, delete) the NVM 114 through the MC 114.

In some examples, the example memory architecture 100 can be implemented in an in-memory database system. In some examples, an in-memory database system is a database management system that uses main memory for data storage. In some examples, main memory includes random access memory (RAM) that communicates with one or more processors (e.g., central processing units (CPUs)), over a memory bus. An in-memory database system can be contrasted with database management systems that employ a disk storage mechanism. In some examples, in-memory database systems are faster than disk storage databases, because internal optimization algorithms can be simpler and execute fewer CPU instructions. In some examples, accessing data in an in-memory database system eliminates seek time when querying the data, which provides faster and more predictable performance than disk-storage databases. In some examples, an in-memory database can be provided as a column-oriented in-memory database, in which data tables are stored as sections of columns of data (rather than as rows of data). An example in-memory database system includes HANA, provided by SAP SE of Walldorf, Germany. At the hardware level, the DRAM 110 and NVM 114 (e.g., memory chips) are assigned distinct physical address regions. This corresponds to how the basic input/output system (BIOS) reports dual in-line memory module (DIMMs) and their physical address ranges to the OS.

Figure 2:
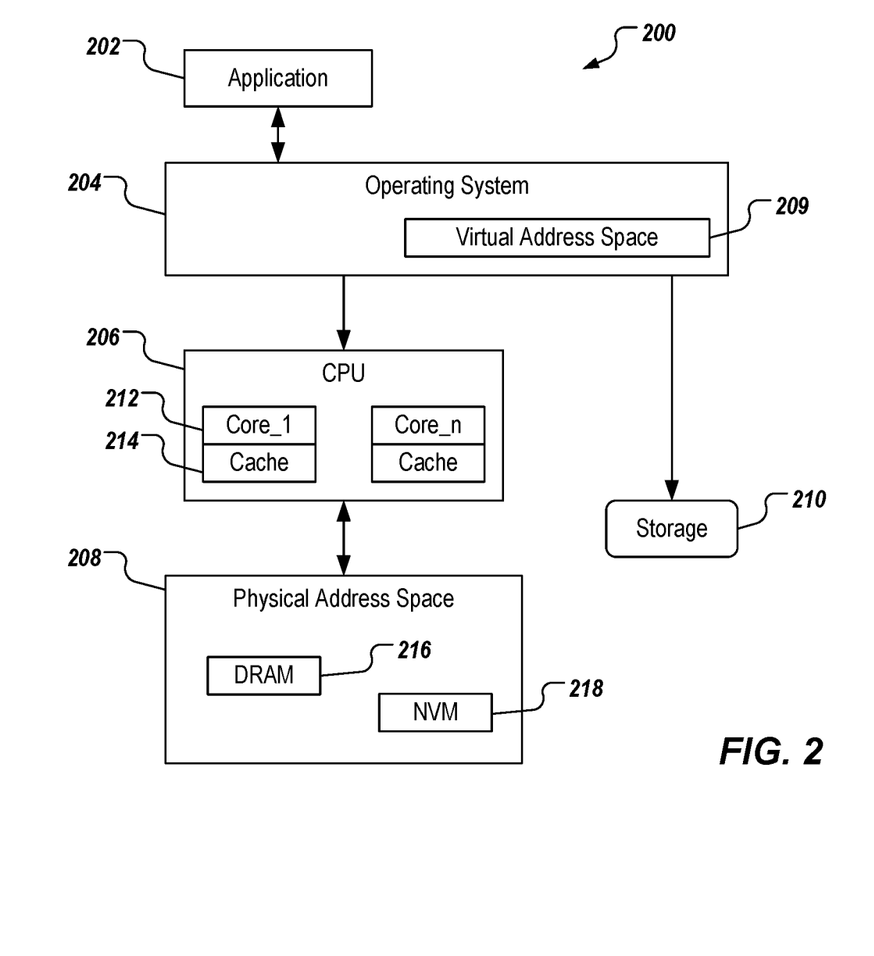
FIG. 2 depicts an example architecture in accordance with implementations of the present disclosure.

FIG. 2 depicts an example architecture 200 for storing data. In the depicted example, the example architecture 200 includes an application 202, an OS 204, a CPU 206, a physical address space 208, a virtual address space 209, and storage 210. In some examples, execution of the application 202 is coordinated by the OS 204. The CPU 206 includes a plurality of cores 212 (Core_1, . . . , Core_n) with respective caches 214 (e.g., last-level cache (LLC)). In some examples, the CPU 206 coordinates read/write access to the physical address space 208, which, in the example context, is provided as a hybrid main memory (e.g., the main memory system 104 of FIG. 1), described herein. Accordingly, the physical address space 208 includes DRAM 216 and NVM 218 (e.g., for storing hot objects and cold objects, respectively).

In some examples, the application 202 is the application, for which data allocations between the DRAM 216 and NVM 218 are to be made. In some examples, the virtual address space 209 is provided as a set of binary addresses that is used by the operating system 204 to allocate memory addresses to any process requesting the memory. In some examples, the virtual address space 209 enables the processes to use more memory addresses than the actual DRAM memory available in the system. In some implementations, the operating system 204 manages the mappings between virtual addresses and physical addresses. In some examples, the storage 210 is provided as hard disk drive that is used for permanent storage of data.

To provide further context for implementations of the present disclosure, the access latency (e.g., time required to read from, or write to memory) of main memory depends upon various factors including the percentage of read operations and write operations to individual banks of DRAM chips. If that percentage of read/write changes, the average access latency of DRAM completely changes. To optimize scheduling of read and write operations within the DRAM memory controller, incoming read and write requests should be distributed to different banks within DRAM chips. Depending the ratio of read-to-write operations, the power consumption of DRAM chips is completely different. In further detail, DRAM banks are structured as storage arrays with multiple cells storing data in an array. Implementations of the present disclosure seek to evenly write data across the available banks in order to increase bank level parallelism when it is required to read the data. When the write requests are evenly distributed, read requests automatically go to multiple banks to achieve parallelism.

In modeling memory, a finite mixture of distributions has proven to be of considerable interest and importance. These distributions are used as models in a variety of situations when studying a nonhomogeneous population, and it is not possible to distinguish between units of each type. The access latency of main memory depends upon various factors including the percentage of read operations, and write operations.

In view of this, implementations of the present disclosure provide a mixed Weibull distribution to model memory access latency under varying percentages $p_1$ and $p_2$ of read operations (r) and write operations (w), respectively. In accordance with implementations of the present disclosure, x represents memory access latency, and the Weibull probability density function is provided as:

$$f(x; \alpha, \beta) = \frac{\alpha}{\beta} y^{\alpha-1} e^{-\frac{y^\alpha}{\beta}} \quad (1)$$

where $\alpha$ is a shape parameter, $\beta$ is a scale parameter, and $x>0$, $\alpha>0$, and $\beta>0$. Further, the cumulative distribution function (CDF) is provided as:

$$F(x) = e^{-\frac{(x)^{-\alpha}}{\beta}} \quad (2)$$

A general expression of mixture distribution is provided as:

$$f(x) = \sum_{i=1}^{l} p_i f_i(x) \quad (3)$$

$$F(x) = \sum_{i=1}^{l} p_i F_i(x) \quad (4)$$

where $\alpha_i>0$, $\beta_i>0$, $x\geq 0$, and $p_1+p_2=1$.

Using Equations 1 and 3, a probability density function (PDF) of a mixture of l Weibull distributions can be provided as:

$$f(x; \alpha_i, \beta_i, p_i) = \sum_{i=1}^{l} P_l \frac{\alpha_i}{\beta_i} (x)^{\alpha_i-1} e^{-\frac{1}{\beta_i}(x)^{\alpha_i}} \quad (5)$$

where $x>0$, and $\sum_{i=1}^{l} P_i = 1$.

Using Equations 2 and 4, a CDF of the mixture of l Weibull distributions can be provided as:

$$F(x; \alpha_i, \beta_i, p_i) = 1 - \sum_{i=1}^{l} P_i \left[ e^{-\frac{1}{\beta_i}(x)^{\alpha_i}} \right] \quad (6)$$

where $\sum_{i=1}^{l} P_i = 1$, $\alpha_i>0$, $\beta_i>0$, $X>0$.

In accordance with implementations of the present disclosure, f(x) is the probability of memory access latency, $\alpha_i$ is a unitless Weibull shape parameter, and $\beta_i$ is a Weibull scale parameter in units of access latency. In some implementations, a higher value of $\beta_i$, indicates that the access latency of the main memory is higher, while the value of $\alpha_i$ indicates stability of the access latency. In some examples, and with respect to $\beta_i$, the access latency is specific to a particular DRAM. For a standard DDR3 DRAM, for example, the average access latency is 30 ns for a read operation, or a write operation. The latency can be measured through a benchmark or measuring a round time of read request to DRAM. In some examples, $\alpha_i$ is determined based on the average response times of read requests, or write requests from the DRAM.

As noted above, the access latency of main memory depends upon various factors including the percentage of read operations and write operations. Accordingly, implementations of the present disclosure provide a mixed Weibull distribution with PDF, as described in Equation 5. In some implementations, $l=\{1,2\}$ to model memory access latency under varying percentages $p_1$, $p_2$ of read operations, and write operations, respectively.

In accordance with implementations of the present disclosure, the percentages of read operations, and write operations, $p_1$, $p_2$, respectively, are periodically processed using the mixed Weibull distribution of the present disclosure to determine the probability of memory access latency for each bank in a plurality of DRAM banks. In some implementations, if the probability indicates that there is a sufficient likelihood that the memory access latency will increase for a particular bank, the memory controller can adjust operations in an effort to avoid the memory access latency for the particular bank. For example, it can be determined that a predicted memory access latency exceeds a threshold memory access latency for a particular bank of a plurality of banks. In response, the probability associated with the predicted access memory latency can be compared to a probability threshold. If the probability exceeds the threshold probability, it is determined that there is a sufficient likelihood that the memory access latency will increase for a particular bank. Consequently, the memory controller can act to reduce the probability. For example, the memory controller can perform write operations, and/or read operations on one or more other banks in an effort to change the read-to-write ratio of the particular bank.

In some examples, the memory controller operates like a state machine, and can be sensitive to page-hit and read-to-write memory operations ratio. A page equals to a memory cell within a DRAM memory bank. When the page-access read-to-write ratio changes, certain banks go into a sleep state in order to save power. As a result, the memory controller will start sending write traffic to a single bank, which reduces the bank access parallelism, and thus increases the overall increase in access latency. If the read-to-write ratio starts changing, the number of banks being used to serve those request also changes. This behavior of DRAM banks not only impacts the access latency but also the power used by the DRAM. Accordingly, implementations of the present disclosure can change states of one or more banks to provide the parallelism described herein (e.g., change a bank from a sleep state to an active state to read/write from the bank).

Figure 3:
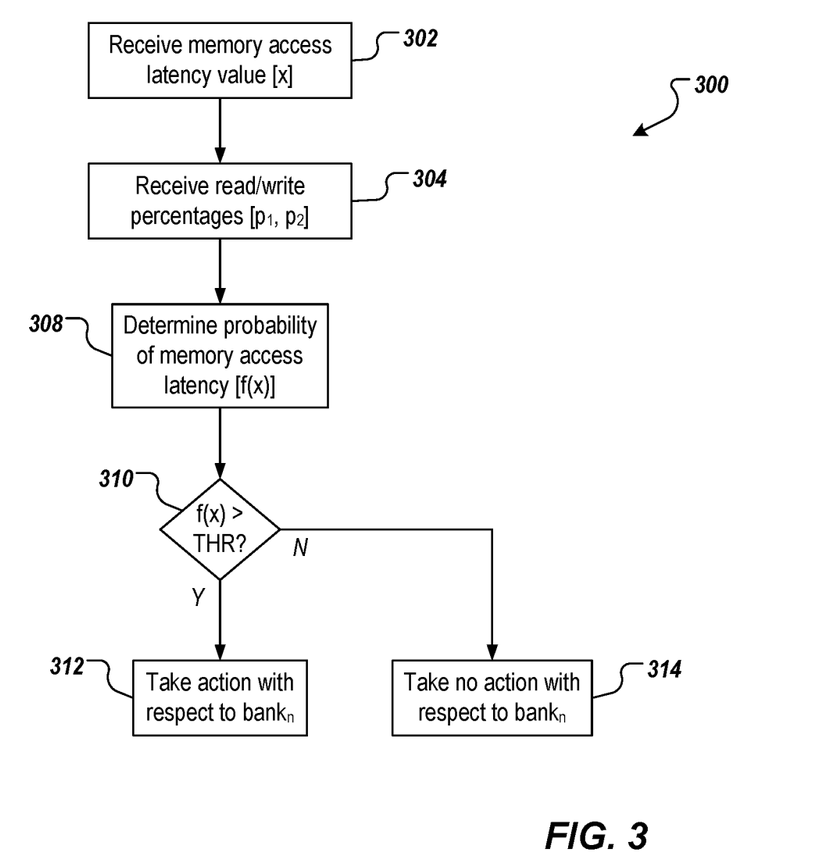
FIG. 3 depicts an example process that can be executed in accordance with implementations of the present disclosure.

FIG. 3 depicts an example process 300 that can be executed in accordance with implementations of the present disclosure. In some implementations, the example process 300 can be realized using one or more computer-executable programs executed using one or more computing devices.

In some implementations, the example process 300 is performed for each memory bank in a set of memory banks (e.g., $bank_1$, ..., $bank_m$). In some examples, the example process 300 is periodically performed for each bank (e.g., every X ms, every X s). In some examples, the example process 300 is performed for a bank in response to an operation (e.g., read, write) being performed on the bank.

A memory access latency value x is received (302). In some examples, the memory access latency value x is a threshold latency. For example, implementations of the present disclosure can be executed to avoid occurrence of the memory access latency value x for a bank n in the set of banks (e.g., n=1, m). Read operation and write operation percentages $p_1$, $p_2$, respectively, are received (304). For example, for the particular bank n, numbers of read and write operations can be recorded, and the respective percentages can be determined. A probability of the memory access latency x is determined (308). For example, the probability (f (x)) is determined using Equation 5, above. The probability is compared to a threshold probability (THR) (310). If the probability exceeds the threshold probability, one or more actions are taken with respect to bank n (312). That is, action is taken, because the likelihood that bank n will achieve the memory access latency value x is sufficiently high. For example, the memory controller adjusts operation scheduling to perform operations on one or more other banks in the set of banks (e.g., on bank(s) with a lower likelihood of hitting the memory access latency value x). If the probability does not exceed the threshold probability, no actions are taken with respect to bank n (314). That is, action is not taken, because the likelihood that bank n will achieve the memory access latency value x is not sufficiently high. For example, the memory controller schedule operations with respect to bank n, as normal.

Figure 4:
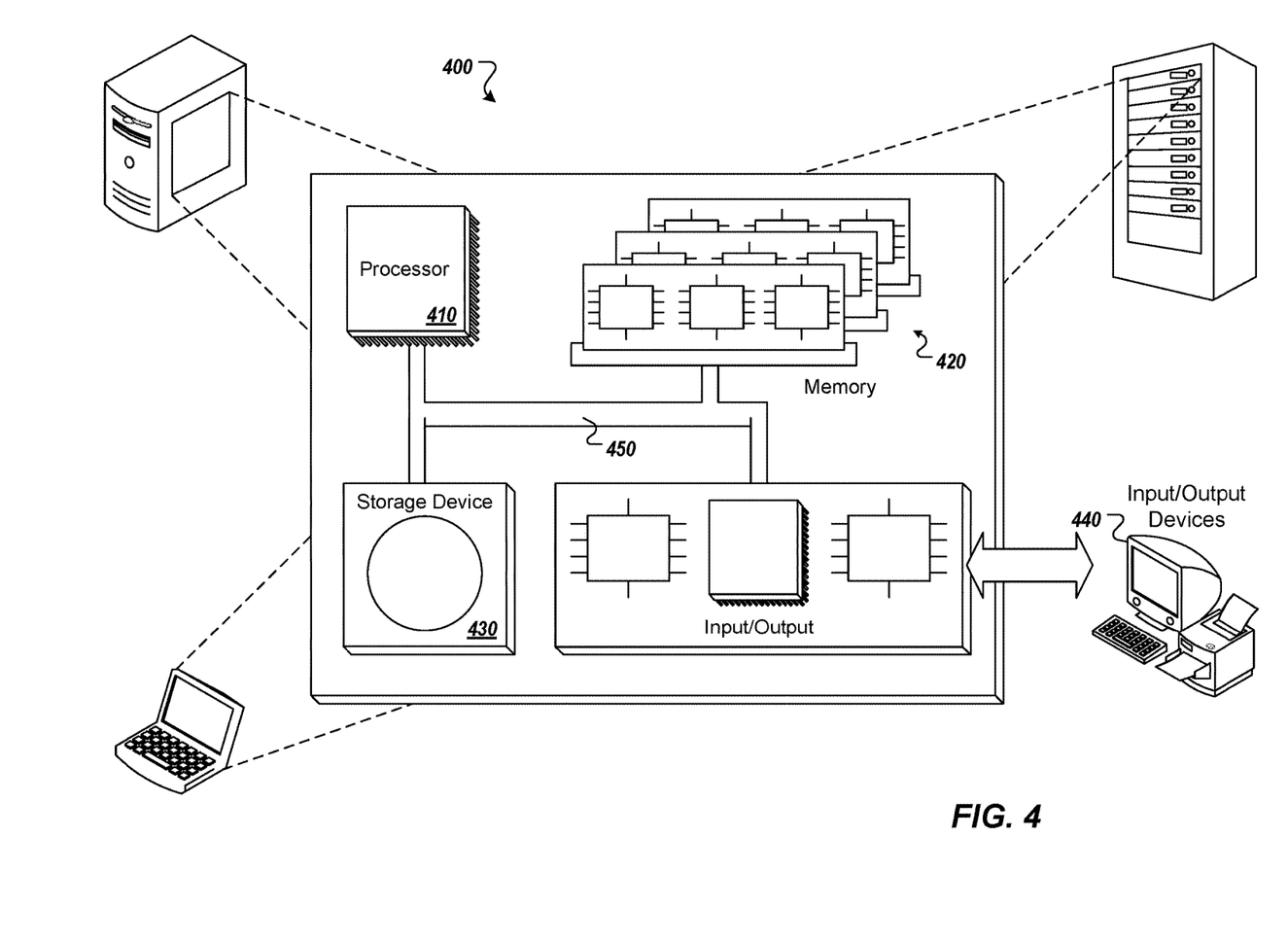
FIG. 4 is a schematic illustration of example computer systems that can be used to execute implementations of the present disclosure.

Referring now to FIG. 4, a schematic diagram of an example computing system 400 is provided. The system 400 can be used for the operations described in association with the implementations described herein. For example, the system 400 may be included in any or all of the server components discussed herein. The system 400 includes a processor 410, a memory 420, a storage device 430, and an input/output device 440. Each of the components 410, 420, 430, 440 are interconnected using a system bus 450. The processor 410 is capable of processing instructions for execution within the system 400. In one implementation, the processor 410 is a single-threaded processor. In another implementation, the processor 410 is a multi-threaded processor. The processor 410 is capable of processing instructions stored in the memory 420 or on the storage device 430 to display graphical information for a user interface on the input/output device 440.

The memory 420 stores information within the system 400. In one implementation, the memory 420 is a computer-readable medium. In one implementation, the memory 420 is a volatile memory unit. In another implementation, the memory 420 is a non-volatile memory unit. The storage device 430 is capable of providing mass storage for the system 400. In one implementation, the storage device 430 is a computer-readable medium. In various different implementations, the storage device 430 may be a floppy disk device, a hard disk device, an optical disk device, or a tape device. The input/output device 440 provides input/output operations for the system 400. In one implementation, the input/output device 440 includes a keyboard and/or pointing device. In another implementation, the input/output device 440 includes a display unit for displaying graphical user interfaces.

The features described can be implemented in digital electronic circuitry, or in computer hardware, firmware, software, or in combinations of them. The apparatus can be implemented in a computer program product tangibly embodied in an information carrier (e.g., in a machine-readable storage device) for execution by a programmable processor; and method steps can be performed by a programmable processor executing a program of instructions to perform functions of the described implementations by operating on input data and generating output. The described features can be implemented advantageously in one or more computer programs that are executable on a programmable system including at least one programmable processor coupled to receive data and instructions from, and to transmit data and instructions to, a data storage system, at least one input device, and at least one output device. A computer program is a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other unit suitable for use in a computing environment.

Suitable processors for the execution of a program of instructions include, by way of example, both general and special purpose microprocessors, and the sole processor or one of multiple processors of any kind of computer. Generally, a processor will receive instructions and data from a read-only memory or a random access memory or both. Elements of a computer can include a processor for executing instructions and one or more memories for storing instructions and data. Generally, a computer can also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM and DVD-ROM disks. The processor and the memory can be supplemented by, or incorporated in, ASICs (application-specific integrated circuits).

To provide for interaction with a user, the features can be implemented on a computer having a display device such as a CRT (cathode ray tube) or LCD (liquid crystal display) monitor for displaying information to the user and a keyboard and a pointing device such as a mouse or a trackball by which the user can provide input to the computer.

The features can be implemented in a computer system that includes a back-end component, such as a data server, or that includes a middleware component, such as an application server or an Internet server, or that includes a front-end component, such as a client computer having a graphical user interface or an Internet browser, or any combination of them. The components of the system can be connected by any form or medium of digital data communication such as a communication network. Examples of communication networks include, e.g., a LAN, a WAN, and the computers and networks forming the Internet.

The computer system can include clients and servers. A client and server are generally remote from each other and typically interact through a network, such as the described one. The relationship of client and server arises by virtue of computer programs running on the respective computers and having a client-server relationship to each other.

In addition, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other implementations are within the scope of the following claims.

A number of implementations of the present disclosure have been described. Nevertheless, it will be understood that various modifications may be made without departing from the spirit and scope of the present disclosure. Accordingly, other implementations are within the scope of the following claims.

What is claimed is:

1. A computer-implemented method for controlling operations performed on a memory bank of a plurality of memory banks, the method being executed by one or more processors, and comprising:

receiving, by the one or more processors, a memory access latency value comprising a time to perform an operation with respect to the memory bank of the plurality of memory banks;

receiving, by the one or more processors, a set of operation percentages comprising an operation percentage $p_i$ for each of a plurality of operations performed on the memory bank;

determining, by the one or more processors, a probability associated with the memory access latency value using a mixture of l Weibull distributions provided as:

$$F(x; \alpha_i, \beta_i, p_i) = \sum_{i=1}^{l} P_i \frac{\alpha_i}{\beta_i} (x)^{\alpha_i - 1} e^{-\frac{1}{\beta_i}(x)^{\alpha_i}}$$

where i=1, . . . , l, $\alpha_i$ is a shape parameter for a respective Weibull distribution i, and $\beta_i$ is a scale parameter for the respective Weibull distribution i;

comparing, by the one or more processors, the probability to a threshold probability to provide a comparison; and selectively executing, by the one or more processors, at least one action with respect to the memory bank based on the comparison.

2. The method of claim 1, wherein the at least one action comprises inhibiting an operation to be performed on the memory bank in response to determining that the probability exceeds the threshold.

3. The method of claim 2, wherein the operation comprises one of a read operation and a write operation to the memory bank.

4. The method of claim 1, wherein l=[1, 2].

5. The method of claim 1, wherein the set of operation percentages comprises a read operation percentage, and a write operation percentage for the memory bank.

6. The method of claim 1, wherein the plurality of memory banks each comprise a dynamic random access memory (DRAM) bank.

7. The method of claim 1, wherein the plurality of memory banks are provided in a main memory system of one or more computing devices.

8. A non-transitory computer-readable storage medium coupled to one or more processors and having instructions stored thereon which, when executed by the one or more processors, cause the one or more processors to perform operations for controlling operations performed on a memory bank of a plurality of memory banks, operations comprising:

receiving a memory access latency value comprising a time to perform an operation with respect to the memory bank of the plurality of memory banks;

receiving a set of operation percentages comprising an operation percentage $p_i$ for each of a plurality of operations performed on the memory bank;

determining a probability associated with the memory access latency value using a mixture of l Weibull distributions provided as:

$$f(x; \alpha_i, \beta_i, p_i) = \sum_{i=1}^{l} P_i \frac{\alpha_i}{\beta_i} (x)^{\alpha_i - 1} e^{-\frac{1}{\beta_i}(x)^{\alpha_i}}$$

where i=1, . . . , l, $\alpha_i$ is a shape parameter for a respective Weibull distribution i, and is a scale parameter for the respective Weibull distribution i;

comparing the probability to a threshold probability to provide a comparison; and selectively executing at least one action with respect to the memory bank based on the comparison.

9. The computer-readable storage medium of claim 8, wherein the at least one action comprises inhibiting an operation to be performed on the memory bank in response to determining that the probability exceeds the threshold.

10. The computer-readable storage medium of claim 9, wherein the operation comprises one of a read operation and a write operation to the memory bank.

11. The computer-readable storage medium of claim 8, wherein l=[1, 2].

12. The computer-readable storage medium of claim 8, wherein the set of operation percentages comprises a read operation percentage, and a write operation percentage for the memory bank.

13. The computer-readable storage medium of claim 8, wherein the plurality of memory banks each comprise a dynamic random access memory (DRAM) bank.

14. The computer-readable storage medium of claim 8, wherein the plurality of memory banks are provided in a main memory system of one or more computing devices.

15. A system, comprising:

a computing device; and a computer-readable storage device coupled to the computing device and having instructions stored thereon which, when executed by the computing device, cause the computing device to perform operations for controlling operations performed on a memory bank of a plurality of memory banks, operations comprising:

receiving a memory access latency value comprising a time to perform an operation with respect to the memory bank of the plurality of memory banks;

receiving a set of operation percentages comprising an operation percentage $p_i$ for each of a plurality of operations performed on the memory bank;

determining a probability associated with the memory access latency value using a mixture of l Weibull distributions provided as:

$$f(x; \alpha_i, \beta_i, p_i) = \sum_{i=1}^{l} P_i \frac{\alpha_i}{\beta_i} (x)^{\alpha_i - 1} e^{-\frac{1}{\beta_i}(x)^{\alpha_i}}$$

where i=1, . . . , l, $\alpha_i$ is a shape parameter for a respective Weibull distribution i, and $\beta_i$ is a scale parameter for the respective Weibull distribution i;

comparing the probability to a threshold probability to provide a comparison; and selectively executing at least one action with respect to the memory bank based on the comparison.

16. The system of claim 15, wherein the at least one action comprises inhibiting an operation to be performed on the memory bank in response to determining that the probability exceeds the threshold.

17. The system of claim 16, wherein the operation comprises one of a read operation and a write operation to the memory bank.

18. The system of claim 15, wherein l=[1, 2].

19. The system of claim 15, wherein the set of operation percentages comprises a read operation percentage, and a write operation percentage for the memory bank.

20. The system of claim 15, wherein the plurality of memory banks each comprise a dynamic random access memory (DRAM) bank.

* * * * *